(12) United States Patent
Tang

(10) Patent No.: US 7,557,303 B2
(45) Date of Patent: Jul. 7, 2009

(54) ELECTRONIC COMPONENT CONNECTION SUPPORT STRUCTURES INCLUDING AIR AS A DIELECTRIC

(75) Inventor: George C. Tang, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 263 days.

(21) Appl. No.: 11/641,989

(22) Filed: Dec. 18, 2006

(65) Prior Publication Data

US 2008/0142250 A1 Jun. 19, 2008

(51) Int. Cl.
*H05K 1/11* (2006.01)
(52) U.S. Cl. ...................................... 174/255
(58) Field of Classification Search ............... 439/66, 439/74; 174/255, 261, 262; 361/761, 777
See application file for complete search history.

(56) References Cited

U.S. PATENT DOCUMENTS

| | | | | |
|---|---|---|---|---|
| 4,399,484 A | * | 8/1983 | Mayer | 361/689 |
| 4,423,376 A | * | 12/1983 | Byrnes et al. | 324/756 |
| 4,641,222 A | * | 2/1987 | Derfiny et al. | 361/768 |
| 4,732,446 A | * | 3/1988 | Gipson et al. | 385/24 |
| 4,959,750 A | * | 9/1990 | Cnyrim et al. | 361/761 |
| 4,963,822 A | * | 10/1990 | Prokopp | 324/758 |
| 4,998,180 A | * | 3/1991 | McAuliffe et al. | 361/684 |
| 5,121,290 A | * | 6/1992 | Azar | 361/692 |
| 5,175,496 A | * | 12/1992 | Collins et al. | 324/754 |
| 5,385,477 A | * | 1/1995 | Vaynkof et al. | 439/66 |
| 5,386,343 A | * | 1/1995 | Pao | 361/761 |
| 5,699,231 A | * | 12/1997 | ElHatem et al. | 361/752 |
| 6,154,370 A | * | 11/2000 | Degani et al. | 361/761 |
| 6,291,776 B1 | * | 9/2001 | Markovich et al. | 174/262 |
| 6,417,684 B1 | * | 7/2002 | Schmid et al. | 324/761 |
| 6,709,279 B2 | * | 3/2004 | Uratsuji | 439/71 |
| 7,139,177 B2 | * | 11/2006 | Gottlieb | 361/788 |
| 2003/0087546 A1 | * | 5/2003 | Hellriegel et al. | 439/457 |
| 2006/0185890 A1 | * | 8/2006 | Robinson | 174/255 |
| 2008/0318454 A1 | * | 12/2008 | Wu et al. | 439/84 |

FOREIGN PATENT DOCUMENTS

JP 1-292885 * 11/1989

* cited by examiner

*Primary Examiner*—Neil Abrams
(74) *Attorney, Agent, or Firm*—Matthew F. Lambrinos; Luis M. Ortiz; Kermit D. Lopez

(57) ABSTRACT

Electronic component supporting mediums includes dielectric support material having voids adapted to include the use of air as a dielectric, which is commonly used in printed circuit boards and electrical connectors. The support medium provides physical support to conductive connections and a mechanical structure to enable electrical connections between electronic components. Support structures including air as a dielectric can be provided in the form of printed circuit boards and electrical connectors. A printed circuit board wherein said dielectric material comprises a low loss material. The support medium can comprise a low loss material such as air, FR-4, Teflon material, and plastic.

2 Claims, 2 Drawing Sheets

ELECTRONIC COMPONENT CONNECTION SUPPORT STRUCTURES INCLUDING AIR AS A DIELECTRIC

TECHNICAL FIELD OF THE INVENTION

The present invention is generally related to electronic component support mediums including dielectric materials commonly used in printed circuit boards and electrical connectors. More particularly the present invention is related to the use of support structures including air as a dielectric and serving as support for electrical connections between electronic components. The present invention is also related to the use of support structures including air as a dielectric provided in the form of printed circuit boards and electrical connectors.

BACKGROUND

The demand for bandwidth is increasing with more and more devices accessing data networks such as the internet. Current device designs and associated applications are directed to achieve higher operating bandwidths. Bandwidth requirements are increasing because more wireless connections between electronic devices are required as the consumers require remote access to the Internet with their cell phones to retrieve large amounts of data, watch real time video content such as watching live sports on their cell phones, etc.

An important aspect of high speed electronic devices actually resides in the design of connections between electronic components, whether the connection is being made via a cable or through printed circuit board traces. Currently, true high bandwidth communication is achieved with optics in order to avoid or reduce noise and signal degradation that can be introduced with electrical interconnects. Large optical networks connect metropolitan areas electronically. For distances in the thousands of miles, an optical connection is perfectly justified; however, now devices must be able to transfer high rates of data between resident components, e.g., as with components resident on a single printed circuit board (PCB) within an electronic system. Within an electronic communication system, for example, electronic components are basically silicon installed onto PC boards and communicate along traces formed on or within a single PCB or through electrical connectors coupling components that are not co-located on the same PCB. Even transferring data short distances, such as millimeters to inches apart, component designers believe that optical connections may be best because optical data transfer can be achieved at very high data-rates.

Optical connections are perhaps the most effective way to transfer data; however, optical interconnect systems are more expensive than electrically-based systems. The present inventor believes that optical connections will continue to be used and have their place; however, many applications do not require such costly and elaborate designs. Where inter-system communication between components is involved, optical connectivity and its associated expense is not justified. High bandwidth can be achieved using the teaching of the present invention.

Currently, signals travel along copper traces in/on a PC board. Signals driven from a transmitter of a silicon-based component to the receiving component associated with another silicon substrate. The highest speed non-optical connector currently in use can probably achieve 15-20 gigabits. Higher transfer rates are not obtainable given the current connector designs because pin-and-socket connection geometries are inherently "resonating structures."

Pin-and-socket connectors are basically a male connector and a female mating part. The male connector has a protruding copper pin; the female connector has a socket which is used to receive the pin. The problem is that such geometry is an inherent resonating structure. This design forms, within the connector, a microwave cavity, which is a resonating geometry. A resonance circuit has a very high Q ("Q" is the quality of the resonance). A very high Q results in a very strong resonance with very little power, creating a low-loss circuit. Although a passive circuit, it has a very strong resonance because it has a very well defined resonance frequency. The typical connector pin and socket geometry can start to resonate at 10-20 gigahertz, which presents a problem. The resonance circuit has a specific frequency. When a broadband signal is driven into that circuit, it excites the resonance of the circuit. If the desire is to drive a signal of any other frequency than is related to the resonating frequency, the connection design basically "filters out" the out-of-band signal. Thus no other signal except for that resonating signal can be effectively transmitted.

When driving a circuit having a geometry that can resonate at a particular frequency with a variety of frequency signals into the resonating circuit, no other signal can usually sustain itself except for the signal associated with resonating frequency provided by the circuit's geometry. All the other frequencies may be suppressed except for those in the resonating frequency range. This is a problem where hardware designs or assembly mistakes cause the circuit to resonate. Ideally, the path where data is transmitted from point A (or circuit A) to point B (or circuit B) should not be a resonating circuit (with resonance determined by the physical properties of the interconnects) because broadband data signal is usually transmitted across this path. Resonating interconnect is of limited use if it resonates when signals are driven into it, and it will only pass through a certain frequency of signal and will suppress all other frequencies because of circuit resonance. Circuit resonance is the problem with the inherent geometries of the pin and socket connector and mating PCB designs.

Some connectors comprise through-hole device installation into the PC Board, which is where one side of the PCB has a socket for the connector to mate with (the mating part) and the other side has a small, sharp-edged metal pin that extends out through the back of the PCB and creates a metal stub. The metal stub is associated with a component, is passed through the PCB socket and facilitates soldering of components to traces or sockets at the back side of PCBs. The stub is physically secured by solder on one side (typically the back side) of a PCB, but is electrically "floating". That floating end of the stub is not connected to anything on the board and is merely floating from an electrical standpoint. A floating piece of metal will also resonate at high frequencies. Resonance is not desired because it can suppress other frequencies except for the resonating frequency. A resonant circuit can act similar to a filter and attenuate/suppress all signals outside of the resonant frequency band and can introduce noise.

Another problem exists where PCBs and connectors are made of a plastic shell or the like. Today a dielectric material like plastic or FR-4 is typically used for connectors and PCBs. FR-4 stands for Fire Retardant Type 4 so it is a safety material. FR4 is inexpensive; however, the problem with FR-4 and other plastic materials is that as frequencies increase to microwave levels, plastic and FR4 start to become energy absorbers. FR4 dissipates energy in the form of heat which causes electrical energy to convert into thermal energy. Where radio frequency components are involved in a connection (either via PCB or connector), the dielectric material will heat up proportionally to the increases in frequency into multi-gigahertz range. The reason for the heat up is that the dielectric material is bombarded by microwave energy causing the molecular bonds (covalent bonds) to vibrate. FR4 and other Plastic material absorb microwave energy. The electrons in plastic or glass, e.g., such as in the dielectric material of a PCB, becomes excited and they absorb high frequency electromagnetic-field-generated energy. Plastic connector shells also heat up. As an electrical signal is passed through the pins in a connector, the electrical waves propagate between the signal pins within a plastic structural device typically associated with the pin receiver to prevent the pin from bending or shorting into the adjacent pin. The pin is captured by a plastic shell, which provides the mechanical structure and strength to the pin, also absorbs energy from the electrical signal carried by the pin. The transmission of high frequency signals on pins causes the plastic shell to heat up as it absorbs the energy.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings and abstract as a whole.

Air is a lossless propagating medium for electrical waves. In order to reduce or eliminate the problems associated with signal attenuation due to propagation medium energy absorption, the inventor proposes replacing as much physical dielectric material as possible with air. Of course, air has moisture and moisture itself is a lossy material. But it can be appreciated that in normal electronic environments where the moisture is kept low, air is a lossless material. For high moisture environments, electrical components and interconnects, including PCB's and connectors, can be coated with a layer of varnish to seal against moisture.

The present inventor has found that higher frequency propagation without dielectric medium energy loss can be achieved by eliminating plastics within signal paths. Plastic dielectric use is avoided by enabling signals to travel through copper pins using air as a dielectric surrounding the pin connections.

Air can be a good dielectric material because it doesn't react to local component energy as does a physical material such as FR4 or plastic; however electronic components cannot be suspended in air without physical structure to support them. Accordingly, it is a feature of the present invention to incorporate air as a dielectric within electrical interconnects by configuring physical dielectric material, such as FR4, in a manner where it is merely used as component support structure and provides physical strength for suspending electrical components and connections (e.g., transmitters, receivers, pins, or traces). With less use of physical material, operating frequencies for electronic components and circuitry can be greatly increased.

Accordingly, an electronic component connection assembly is described as that comprises a dielectric material support structure having voids formed therein to include air as a dielectric with metal connections formed within the air dielectric material supported by the physical dielectric structure. The dielectric material support structure serves to support electrical connections between said metal connections and at least one electronic component. The dielectric material support structure can be made of a lossy medium such as FR-4, Teflon or plastic.

In accordance with another feature of the invention, the support structure can be provided in the form of at least two dielectric washers held within a hollow housing material, said washers being adapted with holes to receive and support wires/traces designed to carry signals between two electronic components.

In accordance with yet another feature of the present invention, support structures can be provided in the form of a printed circuit board.

BRIEF DESCRIPTION OF THE DRAWINGS

The accompanying figures, in which like reference numerals refer to identical or functionally similar elements throughout the separate views and which are incorporated in and form part of the specification, further illustrate embodiments of the present invention.

DETAILED DESCRIPTION OF THE INVENTION

The particular values and configurations discussed in these non-limiting examples can be varied and are cited merely to illustrate embodiments of the present invention and are not intended to limit the scope thereof.

The initial problem with only using air as a dielectric is that it does not provide physical structure and mechanical strength to electronic circuitry or interconnecting conductors between components.

Figure 1:
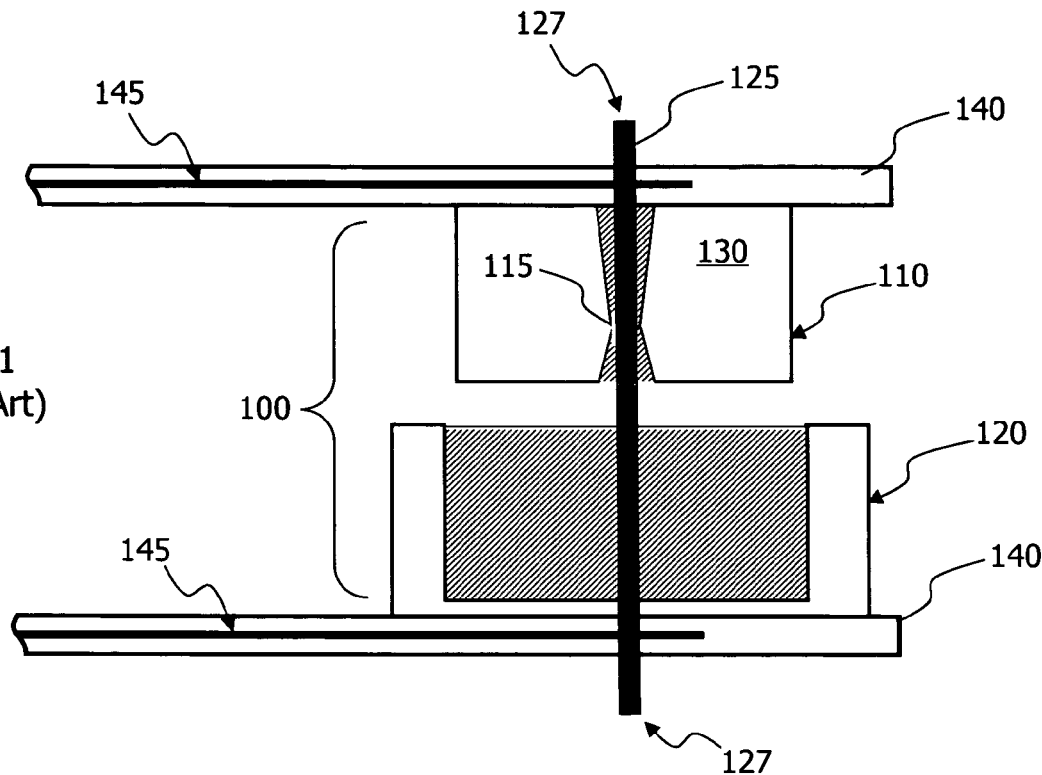
FIG. 1, labeled as Prior Art, illustrates a typical connector including a socket and pin assembly.

Referring to FIG. 1, labeled as "Prior Art", a typical connector 100 includes a socket assembly 110 and pin assembly 120. The socket and pin assemblies can be formed as complementary cylinders (e.g., donut-shaped), although other dimensions can be appreciated. The socket assembly 110 typically consists of a plastic shell 130 with a metallic socket 115, such as a spring-loaded metal cylinder or spring clamp fingers, connected to a trace 145 within the socket assembly PCB 141 which is adapted to receive the pin 125 and interface with pin assembly 120, resulting in an electrical connection between a pin 125 and metallic socket 115. The pin 125 is electrically connected to a trace 146 associated with a pin assembly PCB 142. Because the cavity within the socket metal cylinder 115 is hollow, it is susceptible to the excitation of unwanted cavity resonance by the inserted tip of pin 125. Furthermore, as shown in FIG. 1, the extended metal pins protruding through and beyond the PCB's in the back of socket 115 and pin 125 (same as clamping finger tips of socket 115) form electrical stubs and are also susceptible to unwanted resonance.

When the connector 100 is fully secured by the interfacing of the pin assembly 120 with the socket assembly 110, pinch points in the metallic socket 115 make contact with pin 125. The top end of the pin 125 is typically exposed within the hollow area 127 formed by the metallic socket 115. The pin 125 is "electrically floating" within the metallic socket 115 where it is not making physical contact with the metallic socket 115, although it is making an electrical connection to the trace 145 within interfacing circuit board 141 by the metallic socket's 115 electrical connection to the trace 145. Electrical and physical contact, however, is made beneath the tip of the pin 125 at the narrow area of the metallic socket 115. The tip and surface areas of the pin within the metallic socket 115 that are not in physical contact with the metallic socket 115 but are nevertheless located within the hollow metallic socket 115 shown by bracket indicator 127, are considered to be electrically floating. The floating end of the pin 125 acts as an unintentional antenna that can radiate high frequency signal or excite the resonance of the metallic connector's cavity. High frequency signal driven from electrical contact in the PCB 142 onto the floating tip of the pin 125 will excite the socket 115 at 25 or 30 gigahertz creating resonance inside the entire metallic socket 115 and associated cavity 127.

Figure 2:
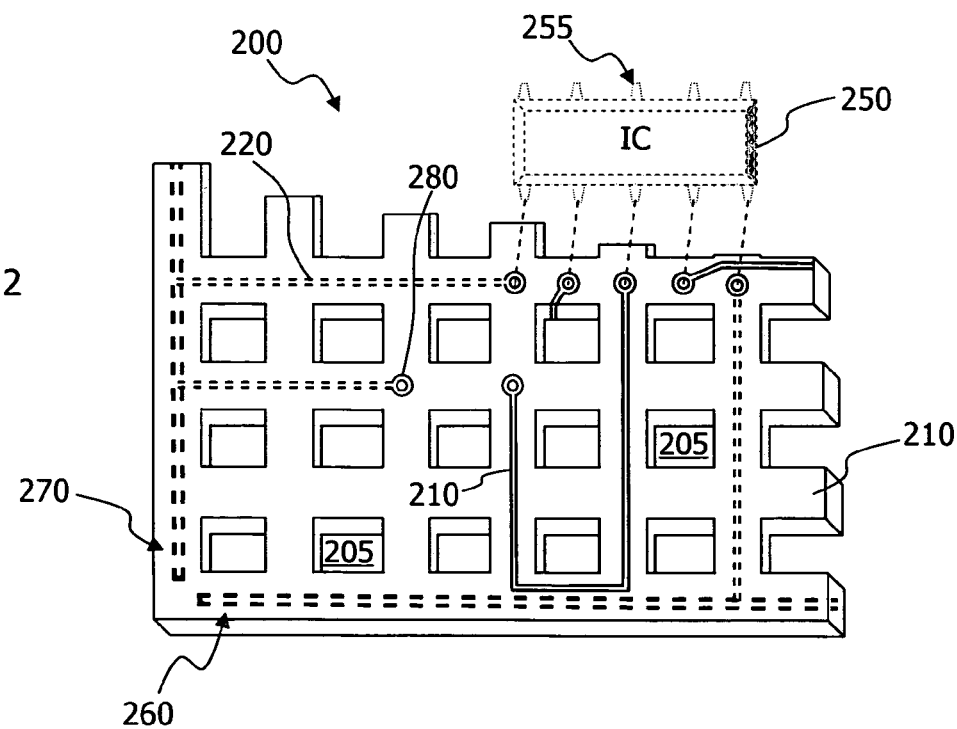
FIG. 2 illustrates a printed circuit board incorporating grided material as support for conductive metal traces and electronic components and incorporating air as a dielectric.

Referring to FIG. 2, a PCB 200 comprised of a grided material 210 is illustrated. The grided material 210 includes a small strip of physical dielectric material formed into a grid structure in a manner that creates large voids 205. The grided material 210 is formed throughout its structure in this manner. The physical dielectric material can be provided as FR4, plastic, Teflon and other low loss material. Teflon is known to be a substantially lower loss material, compared to FR4, in terms of electrical loss. The grid material 210 includes traces 220 formed along either its surfaces or across its voids 205 as shown. The grid material 210 can support electronic components 250. The electrical traces 220 connect pins 255 associated with electronic components 250 in a fixed place on the grid material 210. Space created by the voids 205 provides the air-dielectric to replace materials, such as FR4, that would typically fill the voids 205 in a solid PCB. With introduction of the air-dielectric, electronic circuitry, such as the traces driven by the IC, an electronic component 250, experiences minimum loss in signal strength due to the absence of the energy absorbing dielectric material, such as FR4; yet structure provided by the grid material 210 provides the structural strength required to support electronic components as would a traditional PC board.

To cause an electrical connection between components (e.g., 250) and traces 220 formed on (or within) the grid material 210, each pin 255 of the electronic component 250 can make electrical contact to the traces 220 by drilling a hole into the PCB and creating a 'via' 280. Vias 280 can be formed along the grid to accept the pins. Vias 280 formed at the crossing of grid members can better support and electrically connect the components. High frequency traces 225 can be routed in the void area between the grid members to take advantage of the low loss property of air dielectric material.

Figure 3:
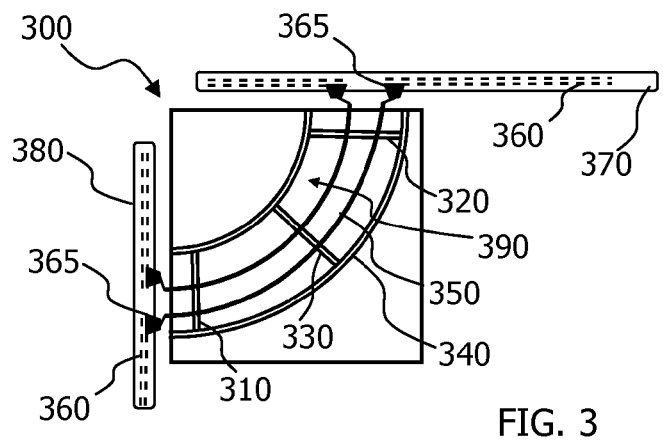
FIG. 3 illustrates an electrical connector coupling connections between two horizontal printed circuit boards and incorporating a hollow plastic shell integrated with at least one small wire suspended within the hollow shell and using air as a dielectric.
Figure 5:
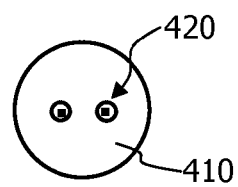
FIG. 5 illustrates a circular disk that supports wires within a hollow plastic shell of a connector in accordance with features of the present invention.
Figure 6:
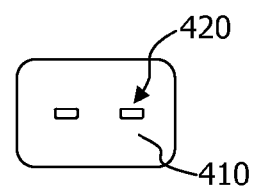
FIG. 6 illustrates a rectangular disk that can also support wires within a hollow plastic shell of a connector in accordance with features of the present invention.

The second embodiment utilizes air as a dielectric in electrical connectors for making connections between PCB's. Referring to FIG. 3, a connector 300 is shown consisting of a hollow plastic shell with three thin-dielectric-slices 310, 320, (at each end) and a center piece 330, of low loss material e.g., Teflon, integrated within a hollow plastic housing 340 and suspending at least one small wire 350 internal to the housing. Referring to FIGS. 5 and 6, the thin-dielectric-slice at each end 310, 320, as well as the center 330, can be provided in the form of a rectangular disk or circular washer 410, although not limited by shape, wherein at least one small hole 420 is formed within the disk or washer to hold the wire (not shown). Referring again to FIG. 3, the small wire 350 is held in place at both ends 310, 320, and at center 330 as shown within the curve of housing 340 and is further connectable to components 370, 380 (e.g., circuit boards) outside of both ends 310, 320 and the housing 340. The wire 350 makes electrical contact at its ends outside of the connector 300/400 with pads 365 that are physically connected to metal traces 360 embedded within the circuit boards 380, 370. As with the grided material PCB described in FIG. 2, what is desired here is that a minimal amount of solid dielectric material be used to hold and suspend electrical connections (e.g., pins, traces) between components. As with the thin-dielectric-slice material in the electrical connector formed into a disk or washer-like shape, the PCB grid 210 shown in FIG. 2 basically behaves similarly as a large washer-like structure. The analogy is clear where a slot in the middle of the grid can facilitate the acceptance of a trace 220 through the inner surface of the grided material 210.

The area between the two ends of dielectric material 310, 320 and the center 330 shown in FIG. 3 provides an air-dielectric 390 that is not as lossy and energy absorbing as a solid connector; yet structural integrity required to suspend connections between components is maintained by the solid dielectric ends 310, 320, center when used (depending on architecture) and hollow housing 340.

Figure 4:
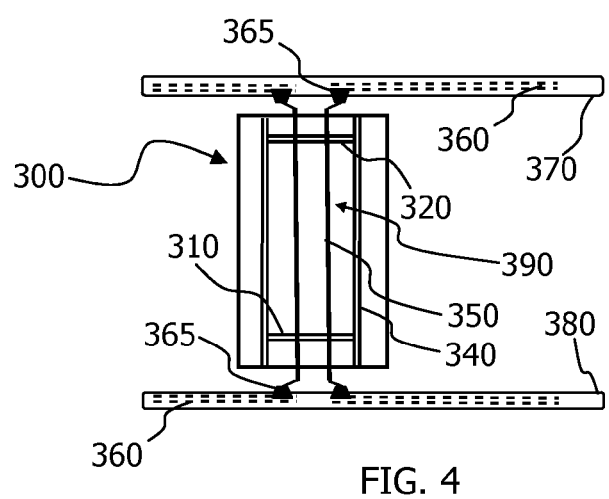
FIG. 4 illustrates an electrical connector formed with a 90-degree curve to couple connections between horizontal and vertical printed circuit boards, the connector incorporating a hollow plastic shell integrated with at least one small wire suspended within the hollow shell and using air as a dielectric.

A curved connector 300 is shown in FIG. 3, but it should be appreciated that a straight connector (no curve) can also be used to connected components. As shown in FIG. 4, in a straight connector design 400, only the two ends 310, 320 would likely be necessary within the hollow housing 340. The center is only necessary in a curved connector as shown because of the bend at the center of the housing 340. In both connector designs, the ends of the wire protrude outside of the connectors Utilizing the connector design illustrated in FIG. 3, a first component 370 can be connected to a second component 380 when conductive pads 365 connecting signal traces 360 (embedded within each component) are contacted by each end of the wire 350 located outside of dielectric material ends 310, 320. The end of each wire can incorporate a slight bend that enables the end to function as a trace with spring-like action adapted to easily mate with (contact) conductive pads 365 located on respective components 370, 380.

The incorporation of air 390 as a dielectric removes most, if not all, of the loss due to the displacement current within the wave propagation medium. By removing the lossy dielectric from the connector design, the bandwidth capacity of the resulting connection can reach higher frequencies, such as beyond 80 gigahertz. Eighty (80) gigahertz corresponds to one hundred sixty (160) gigabits per second, which is operation far beyond the current communication bandwidths achieved with prior connection designs not using optical connections between components. Therefore, it can be appreciated now by the skilled in the art that overall circuit bandwidth can be improved, given the connector systems described herein, and go far beyond the bandwidth of current interconnect systems at a much lower cost (e.g., low material cost and low implementation cost) compared to optical systems using known materials, current tools and current manufacturing facilities.

The invention works just fine for connections found in PC board because inside the connector are copper pins used to carry signals, similar to the traces inside a PC board which do the same. There is little difference between the pin in a connector and a trace on a printed circuit board; they are both merely conductive electrical current carriers.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The invention claimed is:

1. An electronic component connection assembly comprising:
   a dielectric material formed into a grid support structure comprising parallel grid members crossing each other to form rectangular voids therein to include air as a dielectric; and metal connections formed along or in between said dielectric material support structure(s), said dielectric material grid support structure serving to support electrical connections between said metal connections and at least one electronic component;
   wherein said support structure is adapted to operate as a printed circuit board; and
   wherein said electrical connections include high frequency traces routed on sidewall surfaces of said rectangular voids formed between said grid members, and vias formed at the crossings of said grid members in contact with said high frequency traces, said vias accepting pins of said at least electrical component.

2. The electronic component connection assembly of claim 1 wherein said dielectric material comprises Teflon or plastic.

* * * * *